United States Patent [19]

Harada et al.

[11] Patent Number: 5,309,038
[45] Date of Patent: May 3, 1994

[54] SUPERCONDUCTING TOGGLE FLIP-FLOP CIRCUIT AND COUNTER CIRCUIT

[75] Inventors: Yutaka Harada, 2196-416, Honode-Machi Hirai, Nishitama-gun, Tokyo; Hioe Willy, Tokyo, both of Japan

[73] Assignees: Research Development Corporation of Japan; Yutaka Harada, both of Tokyo, Japan; a part interest

[21] Appl. No.: 851,007

[22] Filed: Mar. 11, 1992

[30] Foreign Application Priority Data

Mar. 14, 1991 [JP] Japan .................. 3-49333

[51] Int. Cl.⁵ .............................................. H03K 3/38
[52] U.S. Cl. ............................................ 307/277; 377/93
[58] Field of Search .................. 307/277, 306; 377/93

[56] References Cited

U.S. PATENT DOCUMENTS

| | | | |
|---|---|---|---|
| 3,093,748 | 6/1963 | Anderson | 307/277 |
| 4,489,424 | 12/1984 | Sone | 307/277 |
| 4,956,642 | 9/1990 | Harada | 307/306 |
| 4,983,971 | 1/1991 | Przybysz et al. | 307/277 |
| 5,019,818 | 5/1991 | Lee | 307/277 |
| 5,191,236 | 3/1993 | Ruby | 307/277 |

OTHER PUBLICATIONS

Harada, Y. et al. "Basic Operation of the Quantum Flux Parametron," IEEE Trans. on Magnetics, vol. MAG-23, No. 5, Sep. 1987, pp. 3801-3807.
"1984 Josephson Symposium of the Institute of Physical and Chemical Research Proceedings," pp. 1 to 3, 48 to 78 and 96 to 102.

Primary Examiner—John Zazworsky
Attorney, Agent, or Firm—Keck, Mahin & Cate

[57] ABSTRACT

A high-speed counter capable of counting the number of randomly incoming pulses is constructed by serially connecting a plurality of toggle flip-flop circuits, each of which is activated by input pulses and constructed from an rf-SQUID and the quantum flux parametron, whereby a high-speed computer or a high-speed measurement apparatus can be realised by the use of the high-speed counter.

5 Claims, 7 Drawing Sheets

SUPERCONDUCTING TOGGLE FLIP-FLOP CIRCUIT AND COUNTER CIRCUIT

BACKGROUND OF THE INVENTION

This invention relates to a superconducting switching circuit which operates at very low temperatures, more particularly to a counter circuit using a quantum flux parametron (hereinafter "QFP") which is a parametron type switching circuit using Josephson junctions and which is described in Harada, Y. et al., "Basic Operations of the Quantum Flux Parametron", IEEE Trans. on Magnetics, vol. MAG-23, No. 5, September 1987, pp. 3801–3807.

The QFP is a switching circuit based on a new operation concept, using a dc magnetic flux quantum as a signal medium. The QFP is very adequate for a high speed digital circuit element because it operates at a high speed and dissipates little power.

A flip-flop circuit using the QFP has been disclosed in the proceedings for the 1984 Josephson Symposium of the Institute of Physical and Chemical Research, page 99. The flip-flop circuit comprises a combination of an rf-SQUID and the QFP, the rf-SQUID holds data and the QFP reads out the data from the rf-SQUID. Counters play an important role in the logic elements for digital circuits. Especially, a high speed counter capable of counting the number of pulses at a high speed can be used in many applications, that is, not only in computers but also in analog-digital converters. In principle, the counter circuit can be constructed from a flip-flop circuit and a combinational logic circuit. According to this principle, the counter circuit can be constructed by the use of the QFPs, namely, the counter circuit is constructed from the flip-flop circuit and a combinational logic circuit comprising multiple QFPs. However, since the QFP is a circuit excited by a polyphase ac current, if the counter circuit is constructed using only AC activated QFPs, some problems arise as described below.

1. Since the combinational logic circuit and the flip-flop circuit operate simultaneously with a polyphase ac current, the ac exciting signal needs to be a high-frequency signal and the phase delay of the exciting signal should be precisely controlled to operate the circuits at a high speed.
2. Since input pulses are counted simultaneously with the high-frequency ac exciting current, randomly incoming pulses can not be counted.

SUMMARY OF THE INVENTION

The object of this invention is to provide a high-speed counter with the use of QFPs for counting pulses randomly coming in.

In order to attain this object, in this invention, a toggle flip-flop circuit activated by input pulses is constructed from an rf-SQUID and a QFP, and then a counter circuit is constructed by serially connecting a plurality of the toggle flip-flop circuits.

PREFERRED EMBODIMENTS OF THIS INVENTION

Figure 2:
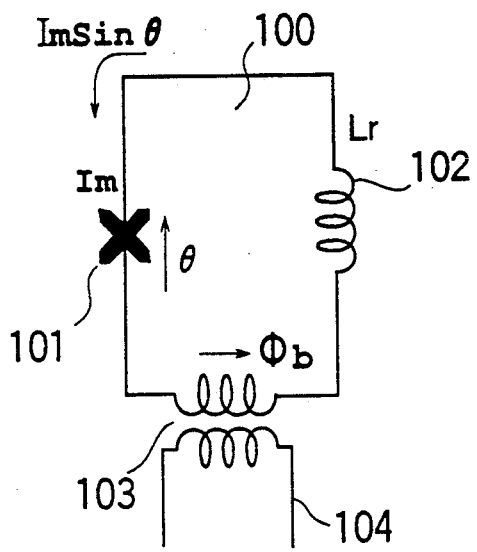
Figure 2:
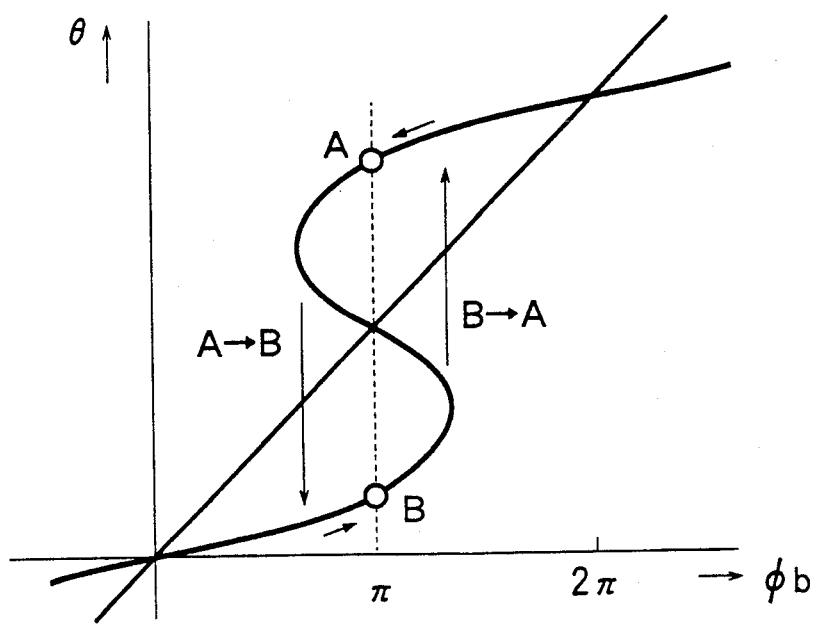

Hereinbelow, examples according to this invention will be explained. FIG. 2a illustrates operation of the rf-SQUID used in the toggle flip-flop according to this invention. An rf-SQUID 100 is a superconducting closed loop including a Josephson junction 101, an inductor 102 and a transformer 103. Bias magnetic flux $\Phi_b$ is supplied to the superconducting closed loop by passing current through the primary windings 104 of the transformer 103. When the phase angle $\Phi_b$ of the bias flux $\Phi_b$ is defined as $\Phi_b = 2\pi\Phi_b/\Phi_0$ by the use of the magnetic flux quantum $\Phi_0$, the characteristic of the rf-SQUID shown in FIG. 2A is represented by Eq.(1) because of flux quantization.

$$\theta + 2\pi(\text{Im } Lr/\Phi_0) \sin \theta - \Phi_b = 2\pi N \quad (1)$$

where $\theta$ is the phase angle of the Josephson junction, Im is the critical current of the Josephson junction 101, Lr is the inductance value of the inductor 102 and N is an integer. FIG. 2b shows the relation between $\theta$ and $\Phi_b$ when N=0. When the product of Im and Lr is made larger than $\Phi_0/2\pi$, the relation shows a hysteretic characteristic as shown in FIG. 2b. In the rf-SQUID with the hysteretic characteristic, when the bias phase angle $\Phi_b$ is set as $\pi$, the operating point of the rf-SQUID 100 becomes point A or point B. In this situation, if point A corresponds to the digital signal "1" and point B corresponds to the digital signal "0", the rf-SQUID can operate as a flip-flop circuit. In order to transit from point A to point B, the transition is carried out along the A→B line by reducing the bias phase angle according to the hysteretic characteristic shown in FIG. 2b or reducing the phase angle of the Josephson junction by way of supplying current from the outside. On the contrary, in order to transit from point B to point A, the transition is carried out along the B→A line in a similar way.

As described above, the circuit shown in FIG. 2a operates as a flip-flop circuit for holding data. In order to construct a counter circuit operated by an input signal, still further contrivances are needed. In this invention, in order to count pulses which randomly come in by the use of the QFP, the following contrivances are adopted.

1) An input pulse signal is used as an exciting current for the QFP, so that the QFP and other circuits are operated whenever the input pulse signal is applied.
2) A toggle flip-flop circuit, the data held in which is inverted whenever the input pulse is applied, is adopted, and a counter circuit is constructed by connecting the toggle flip-flops in multi-stages.

Figure 1:
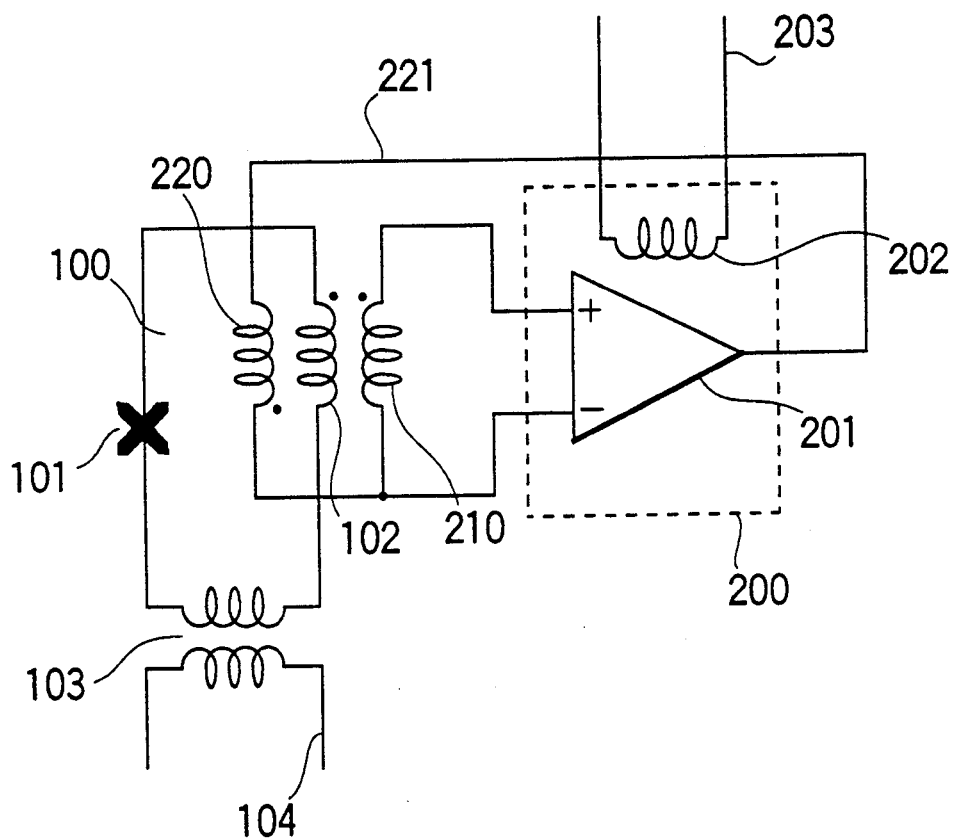
FIG. 1 shows a circuit diagram of a basic toggle flip-flop according to this invention, FIGS. 2(a) and 2(2) illustrate operation of the rf-SQUID acting as a flip-flop.

FIG. 1 is a schematic diagram according to this invention. The circulating current flowing in the rf- SQUID 100 is detected by the inductor 210 which is magnetically coupled with the inductor 102 of the rf-SQUID 100 shown in FIG. 2a, wherein the coupling is made in in-phase mode as denoted by the dots, and the detected signal is inputted to the current amplifier 200. Operation of the current amplifier 200, which may be a QFP, is as follows. The output current of the current amplifier 200 induces in the closed circuit of the rf-SQUID a current with the same direction as the circulating current of the rf-SQUID 100. The induced current inverts the direction of the circulating current of the rf-SQUID and thus inverts the signal held in the flip-flop circuit. In this operation, the use of the input signal as the exciting signal is one of characteristics of this invention.

Figure 3:
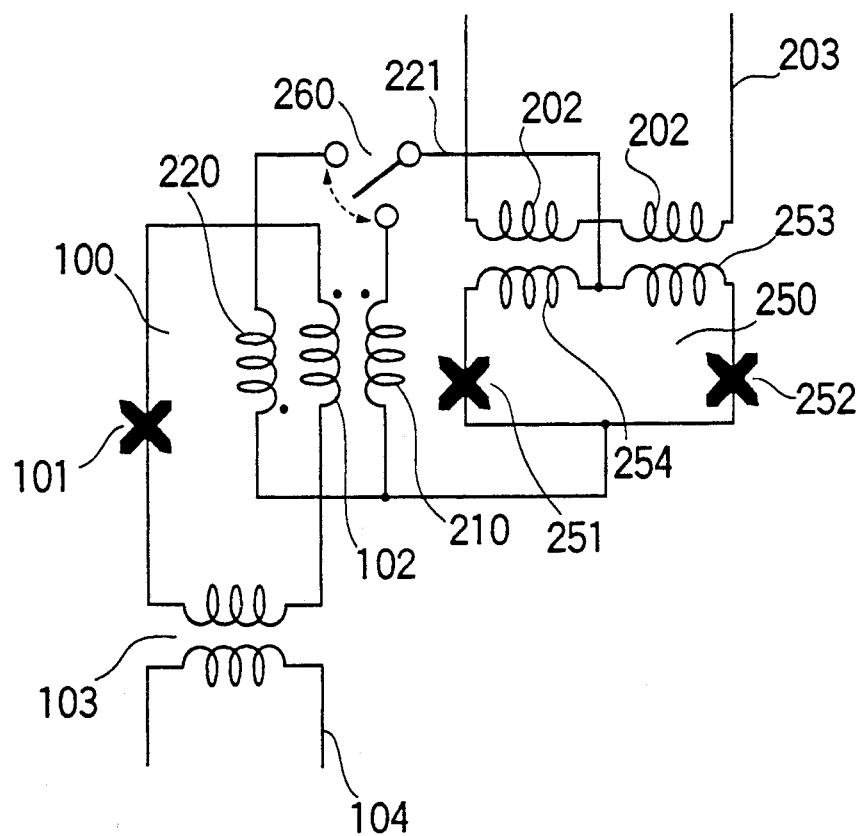
FIG. 3 shows a circuit diagram of an example of a toggle flip-flop using the QFP according to this invention.

FIG. 3 shows an example of this invention where a QFP 250 is adopted as the current amplifier 200. The QFP 250 is a superconducting closed circuit comprising two Josephson junctions 251 and 252 and two exciting inductors 253 and 254 and it is excited through the exciting line 202. Operation of the QFP is disclosed in the above mentioned Harada, Y. et al.. Since the QFP is a two terminal element, an input signal is mixed with an output signal. Therefore, the desired performance can not be obtained only by replacing the current amplifier 200 of FIG. 2 with the QFP 250. FIG. 3 shows a basic means for separating the input signal and the output signal. In FIG. 3, the input signal and the output signal are separated by the switch 260. In this circuit construction, before the QFP 250 is excited, the switch 260 is connected to the inductor 210 and the signal from the rf-SQUID 100 is introduced into the QFP 250. After the QFP is excited, the switch 260 is connected to the feedback inductor 220 and the output current of the QFP 250 is introduced into the feedback inductor 220 to invert the signal(circulating-current) held in the rf-SQUID 100.

Figure 4:
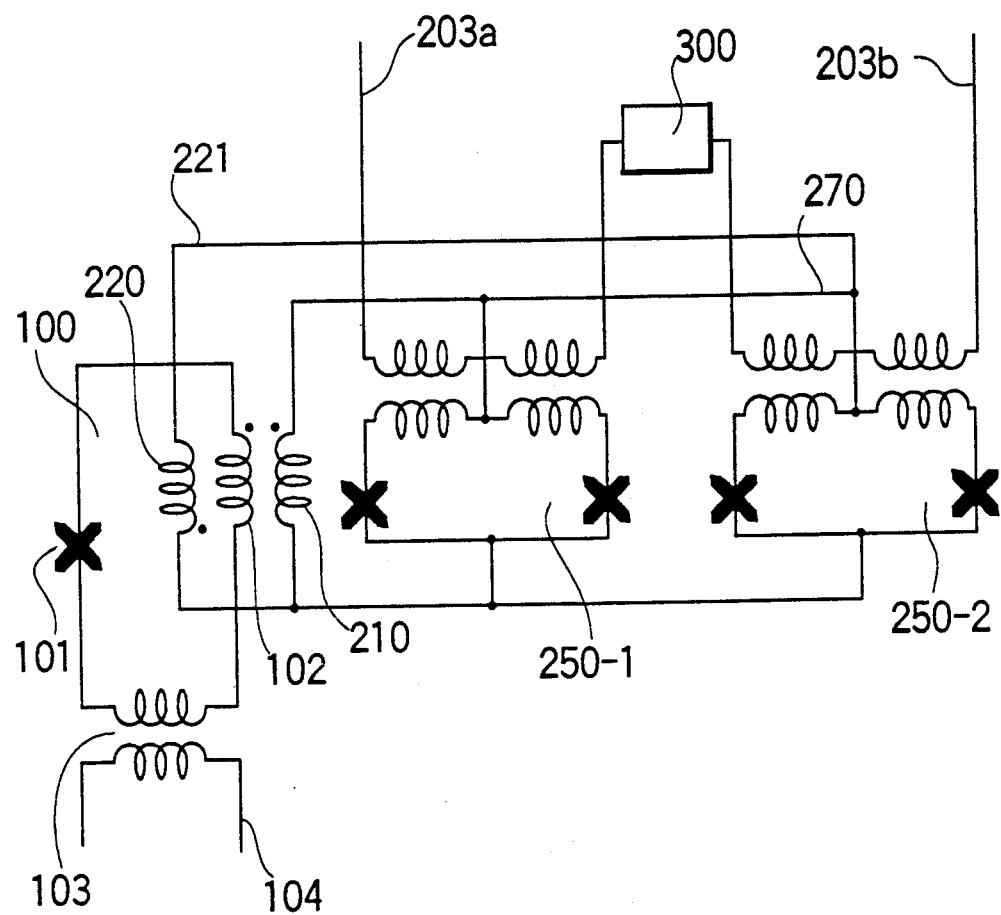
FIG. 4 shows an example of a toggle flip-flop realized by the use of two QFPs.

FIG. 4 is an example in which the QFP is used as the switch 260 of FIG. 3. In the example shown in FIG. 4, the current amplifier 200 comprises two QFPs 250-1 and 250-2 and a delay element 300. The signal of the rf-SQUID 100 detected by the inductor 210 is supplied to the first QFP 250-1. The output signal of the first QFP 250-1 is inputted into the second QFP 250-2. The output signal of the second QFP250-2 is supplied to the feedback inductor 220 through the output line 220. The exciting line 203a excites the first QFP 250-1 and the exciting line 203b excites the QFP 250-2. A delay element 300 is disposed between the exciting lines 203a and 203b. Therefore, the second QFP 250-2 is excited later than the first QFP 250-1 by the delay time of the delay element 300. Therefore, in the circuit shown in FIG. 2, the first QFP 250-1 amplifies the signal from the rf-SQUID 100 and then the second QFP-2 further amplifies the signal and supplies it to the feedback inductor 220.

In this circuit configuration, the output signal from the first QFP 250-1 also flows backward to the inductor 210. Therefore, in order to invert the signal held in the rf-SQUID 100 by supplying an output current larger than the backward current from the second QFP 250-2 to the feedback inductor 220, it is desirable to increase the current level of the second QFP 250-2, for example, by increasing the critical current of the Josephson junctions. The delay element 300 may comprise a signal transmission line but it also may comprise a combination of inductors, capacitors and resistors.

Figure 5:
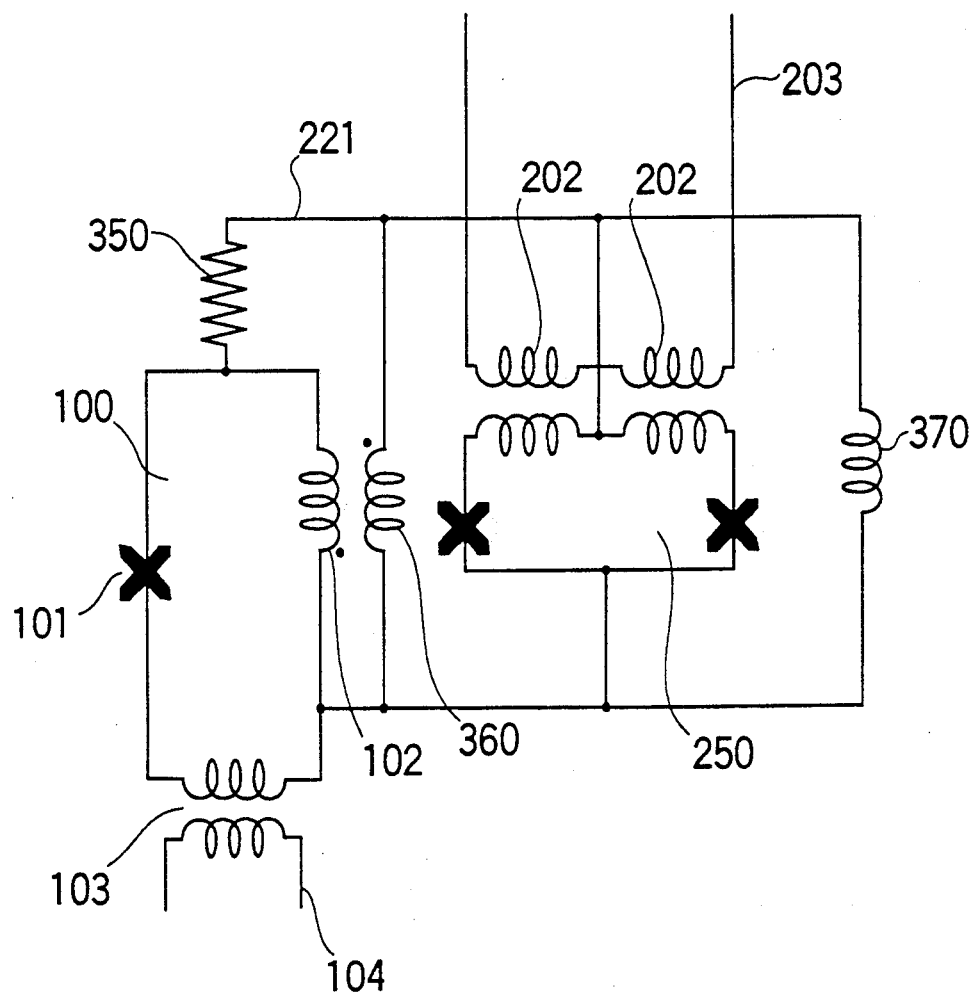
FIG. 5 shows an example of a toggle flip-flop in which a negative feedback is provided by the use of a resistor.

FIG. 5 shows another example in which the input signals are separated from the output signals. In the example of FIG. 5, the signal from the rf-SQUID 100 is supplied to the QFP 250 through an inductor 360, and the output signal of the QFP 250 is fedback to the rf-SQUID 100 through a resistor 350. Generally, the equivalent inductance of the Josephson junction 101 of the rf-SQUID 100 is larger than that of the inductor 102. Thus, in the circuit configuration of FIG. 5, the coupling between the inductor 102 and the inductor 360 is in out-of-phase mode, the feedback current flowing through the resistor 350 is added to the circulating current of the rf-SQUID 100. On the other hand, if the equivalent inductance of the Josephson junction 101 is smaller than that of the inductor 102, the coupling of the inductance 360 will be changed to in-phase mode.

In the construction of FIG. 5, before the QFP 250 is excited, the signal of the rf-SQUID 100 is transmitted to the QFP 250 through the inductor 360. When the QFP 250 is excited, the output current of the QFP 250 is transiently fed back to the rf-SQUID 100 through the resistor 350 and then the circulating current of the rf-SQUID is inverted. As shown in FIG. 5, by connecting the load inductor 370 to the QFP 250, the output current of the QFP 250 can be outputted from the load inductor 370.

Figure 6:
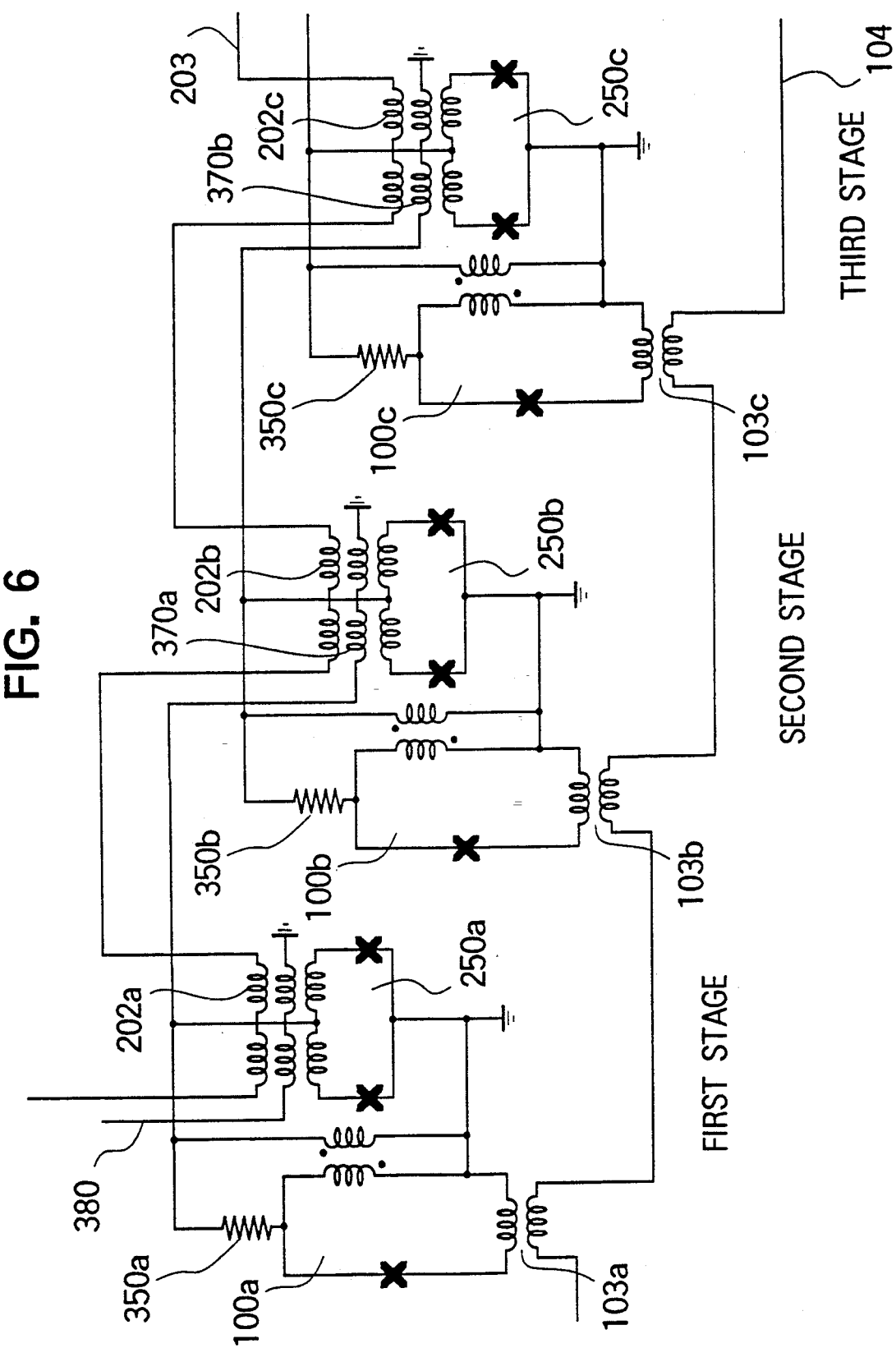
FIG. 6 shows an example of a counter circuit using a toggle flip-flop according to this invention.

FIG. 6 shows an example of the counter circuit using toggle flip-flop circuits according to this invention. In the example of FIG. 6, the toggle flip-flop circuits shown in FIG. 5 are connected in series. After the second stage, the toggle flip-flop is excited by an input pulse signal plus the output current of the foregoing stage toggle flip-flop. Therefore, the load inductor 370 of the foregoing stage is used as an exciting inductor of the next stage. A QFP 250a of a first stage toggle flip-flop is provided with an exciting bias line 380 as well as the input line 203. The QFP 250a is excited by currents flowing through two exciting lines. In the counter circuit of FIG. 6, the levels of the input signal, the output current of the QFP 250 and the exciting bias current of the first stage are set as follows:

1. The QFP is not excited only by an input signal.
2. The QFP is excited when an input signal and an output signal of a foregoing stage are positive.
3. The QFP is not excited when an input signal and an output signal of a foregoing stage are negative.
4. In the first stage, the exciting bias current is constantly supplied to the QFP and then the QFP is excited by an input signal.

Figure 7:
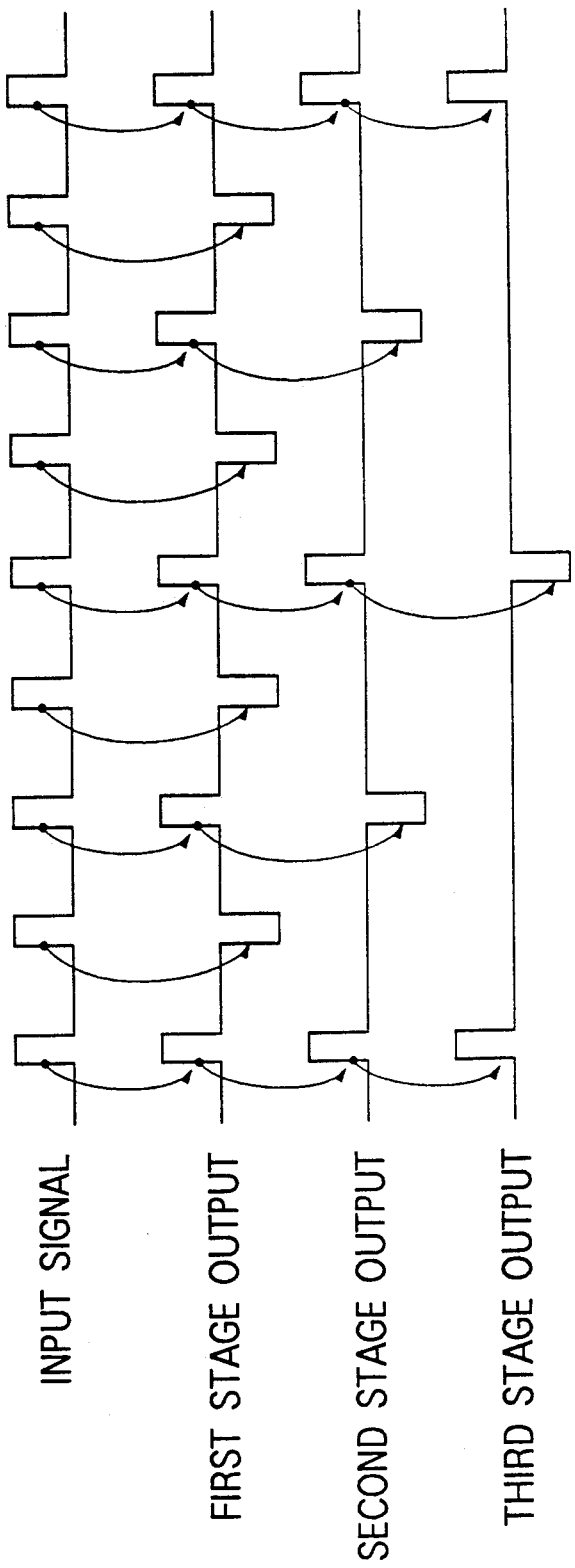
FIG. 7 illustrates operation of the counter circuit shown in FIG. 6.

If the current levels are set as above, the example of FIG. 6 operates as a ripple counter as shown in FIG. 7.

As described above, according to this invention, a high-speed counter circuit can be constructed in a simple construction. Thus, this invention is indispensable to realize a high-speed computer or a high-speed measurement apparatus.

What is claimed is:

1. A superconducting toggle flip-flop circuit comprising:
   an rf-SQUID having a Josephson junction and first and second inductors,
   a first winding for supplying magnetic flux to the first inductor of said rf-SQUID, and
   a current amplifier and a third inductor magnetically coupled with the second inductor of said rf-SQUID, said third inductor being operable to detect a circulating current flowing around said rf-SQUID and feed input current to said current amplifier, said current amplifier being operable to transfer an output current through an output line, and a fourth inductor magnetically coupled in an out-of-phase mode with said second inductor of said rf-SQUID and connected to the output line for receiving the output current, the fourth inductor operable to induce a further current of a same direction as the circulating current in the rf-SQUID such that the further current and circulating current together form a further circulating current and the direction of the further circulating current is inverted from the direction of the circulating current.

2. A superconducting toggle flip-flop circuit claimed in claim 1, wherein said current amplifier comprises at least a quantum flux parametron.

3. A superconducting toggle flip-flop circuit claimed in claim 2, wherein said current amplifier comprises a series connection of first and second stage quantum flux parametrons, the circulating current of the rf-SQUID is inputted into the first stage quantum flux parametron and the second stage quantum flux parametron is operable to output and feed back the output current to said rf-SQUID, whereby the second stage quantum flux parametron is excited by the first stage quantum flux parametron.

4. A superconducting toggle flip-flop circuit claimed in claim 2, wherein the quantum flux parametron is operable to output and feed back the output current to the rf-SQUID through a resistor.

5. A counter circuit comprising a plurality of toggle flip-flop circuits according to claim 1 which are connected in series to form plural stages, wherein the input pulse current is commonly supplied to each of the plurality of toggle flip-flop circuits and the output current of the current amplifier of each toggle flip-flip circuit except a last toggle flip-flop circuit is used as an exciting current for a next stage.

* * * * *